US006738201B2

(12) United States Patent
Lee

(10) Patent No.: US 6,738,201 B2
(45) Date of Patent: May 18, 2004

(54) COMBINED ON-AXIS AND OFF-AXIS ILLUMINATION

(75) Inventor: Thomas D. Lee, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,809

(22) Filed: Mar. 30, 2001

(65) Prior Publication Data

US 2002/0141076 A1 Oct. 3, 2002

(51) Int. Cl.[7] .................................................. G02B 9/08
(52) U.S. Cl. ........................................ 359/738; 359/739
(58) Field of Search ................................ 359/738, 739, 359/740

(56) References Cited

U.S. PATENT DOCUMENTS

| | | | | | |
|---|---|---|---|---|---|
| 593,993 | A | * | 11/1897 | Elwood | 359/738 |
| 3,668,404 | A | * | 6/1972 | Lehovec | 250/552 |
| 4,023,904 | A | * | 5/1977 | Sheets | 359/738 |
| 5,822,135 | A | * | 10/1998 | Lee et al. | 359/738 |
| 6,361,909 | B1 | * | 3/2002 | Gau et al. | 430/30 |

* cited by examiner

*Primary Examiner*—Scott J. Sugarman
(74) *Attorney, Agent, or Firm*—George Chen

(57) ABSTRACT

The present invention describes an aperture comprising an opaque plate with a central opening and at least one peripheral opening and a method for combining an on-axis component and at least one off-axis component of illumination light.

4 Claims, 4 Drawing Sheets

COMBINED ON-AXIS AND OFF-AXIS ILLUMINATION

BACKGROUND OF THE INVENTION

1. Field of the Invention

The present invention relates to the field of semiconductor integrated circuit (IC) manufacturing, and more specifically, to improving process control of critical dimension (CD) in lithography.

2. Discussion of Related Art

Photolithography is the process by which a pattern of features on a mask is transferred into a layer of photoresist on a wafer. A latent image is created in the photoresist by exposure to light energy in an imaging tool. Subsequently, a develop process selectively removes portions of the photoresist layer which correspond to the latent image. The pattern realized in the photoresist is then replicated through an etch process into the wafer.

The yield of microprocessors fabricated on a wafer is affected by the variability in CD of the printed features. CD is influenced by a variety of systematic and random factors. One type of effect derives from the interaction of photolithography with topography, film thickness, and reflectivity of the wafer. A second type of effect comes from non-uniformity of feature CDs on the mask. A third type of effect involves imprecision and inaccuracy of the imaging tool in aligning, leveling, focusing, or exposing the wafer. A fourth type of effect results from aberrations in the optics of the imaging tool.

A layer is often printed on a wafer with a step-and-scan imaging tool or a step-and-repeat imaging tool so as to obtain images with sufficiently high fidelity and accurate placement. A wafer is partitioned into identical small areas called fields that are sequentially exposed through the mask on the imaging tool.

Dose is the amount of light energy per unit area delivered to the wafer plane. Partial coherence, also referred to as sigma, is the numerical aperture (NA) of the illumination optics divided by the NA of the projection optics. NA is a measure of the divergence angle of light energy. NA may be varied by changing the size of an aperture stop at a pupil plane of the condenser or relay lens system.

A pattern being printed may include isolated features and nested features. In a situation where the feature is a line 110, as shown in FIG. 1 (a), the CD of the feature would be the width 114. As shown in FIG. 1 (a), an isolated feature 110 is separated from an adjacent feature 120 by a space 112 that is large compared to the CD 114 of the feature.

As shown in FIG. 1 (b), a nested feature 210 is part of a pattern 230 of repeating features and spaces that are close together. The pitch 216 of the pattern 230 is the sum of the CD 214 of a feature 210 and the space 212 between the feature 210 and a neighboring feature 220. In another situation, the feature may be a round contact hole 310, as shown in FIG. 1 (c). In that case, the CD would be the diameter 314.

As the CDs of the features on a microprocessor become smaller, the within-field CD variability consumes an increasingly larger portion of the overall CD error budget. The within-field CD variability encompasses isolated-dense (iso-dense) bias and horizontal-vertical (H-V) bias. Iso-dense bias involves CD variability related to proximity to other features. H-V bias involves CD variability related to aberrations in the optics or related to non-uniformities in partial coherence between the horizontal direction and the vertical direction.

As the critical dimension (CD) of a printed feature approaches the wavelength of the exposure light, interference of the light diffracted by the features will tend to degrade pattern fidelity. Then it becomes necessary to use a resolution enhancement technique (RET), such as pupil filtering (PF), phase-shifting mask (PSM), or off-axis illumination (OAI). However, application of a RET is often difficult.

PF improves the depth-of-focus (DOF) by putting an intensity filter or a phase filter into the projection lens pupil of an imaging tool. However, accessing the pupil planes in an exposure tool may risk contaminating or damaging the optics within the imaging tool.

PSM improves resolution and DOF by introducing a 180-degree difference in phase between the light transmitted through adjacent openings to cause destructive interference at the boundary. However, the design of a PSM is very complicated due to phase conflicts and artifacts. A PSM is also difficult to fabricate, inspect, and repair due to the three-dimensional structure required to form the phase shifter.

Conventional illumination is usually used to print a feature that has a CD that is large relative to the exposure wavelength of the imaging tool. FIG. 2 (a) shows a conventional aperture 410 that may be used to produce conventional illumination. The conventional aperture 410 has a circular opening 415 in an opaque plate 412.

As the pitch of nested features shrinks, it is often desirable to block out a large fraction of the exposure light that is not useful in printing the features. Such techniques are called OAI. OAI uses a centrally-obstructed aperture to illuminate a mask with the obliquely incident components of the exposure light. Examples of OAI include annular illumination, dipole illumination, and quadrupole illumination. However, conventional implementations of OAI improve the resolution and depth of focus of nested patterns at the expense of a larger iso-dense bias.

FIG. 2 (b) shows an annular aperture 510 that may be used to produce OAI. The annular aperture 510 has a ring-shaped opening 515 in an opaque plate 512. Alternatively, the annulus 515 may be considered to be a circular opening, equivalent in size to the annulus 515, that has a central disk 520 that is opaque.

FIG. 2 (c) shows a quadrupole aperture 610 that may also be used to produce OAI. The quadrupole aperture 610 may be considered as having an imaginary square 617 within an opaque plate 612 that has a circular opening 615 located at each corner of the imaginary square 617.

BRIEF DESCRIPTION OF THE DRAWINGS

FIG. 1 (b) is an illustration of a plane view of a nested feature in the prior art.

FIG. 1 (c) is an illustration of a plane view of a round contact hole in the prior art.

FIG. 2 (b) is an illustration of a plane view of an annular aperture in the prior art.

FIG. 2 (c) is an illustration of a plane view of a quadrupole aperture in the prior art.

FIG. 3 (b) is an illustration of a plane view of a modified and modulated annular aperture according to the present invention.

FIG. 4 (b) is an illustration of a plane view of a modified and modulated quadrupole aperture according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

Off-Axis Illumination (OAI) techniques can be used to improve the print quality of nested features at tight pitches. However, OAI techniques often have the drawback of very steep coherence curves. A coherence curve shows the actual CD of a feature as a function of the pitch. When coherence curves are very steep, the process window overlap between isolated features and nested features becomes small or even non-existent.

In other words, OAI techniques may result in a large variation in the CD of a feature depending on whether the feature is isolated or nested. Having a large isolated-to-nested bias, or iso-dense bias, is undesirable since the process window will be adversely affected. A large iso-dense bias may be reduced, but the fixes are very resource-intensive. One fix is to selectively bias the CDs of the features in the design. Rule-based optical proximity correction (OPC) or model-based OPC or a combination may be used. In both cases, the resolution of the fixes may be limited by the minimum grid size.

The large fraction of conventional illumination that is blocked out in OAI apertures may be divided into type 1 illumination which greatly degrades the aerial images at the desired pitches and type 2 illumination which uniformly raises the background level of the aerial images at the desired pitches. In the case of type 2 illumination, only the zeroth-order diffracted beam is captured by the projection optics at the desired pitches.

The printing quality of isolated features may also be degraded by the presence of aberrations in the lens of the imaging tool. In certain situations, type 2 illumination may print isolated features better than OAI apertures. Consequently, the present invention contemplates the use of all or part of the type 2 illumination to augment OAI so that the printing of the isolated features may be improved without seriously degrading the printing of the nested features.

Various lens NA settings may be selected in an imaging tool. An example of a low lens NA setting is 0.35. An example of a high lens NA setting is 0.68. When a high lens NA setting is used, the amount of type 2 illumination available may be decreased. In such a situation, it may be necessary to add a portion of the type 1 illumination to modulate the aerial image as required.

Figure 1A:
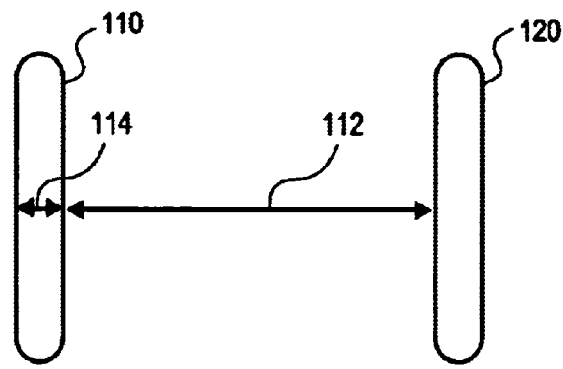
FIG. 1 (a) is an illustration of a plane view of an isolated feature in the prior art.
Figure 1B:
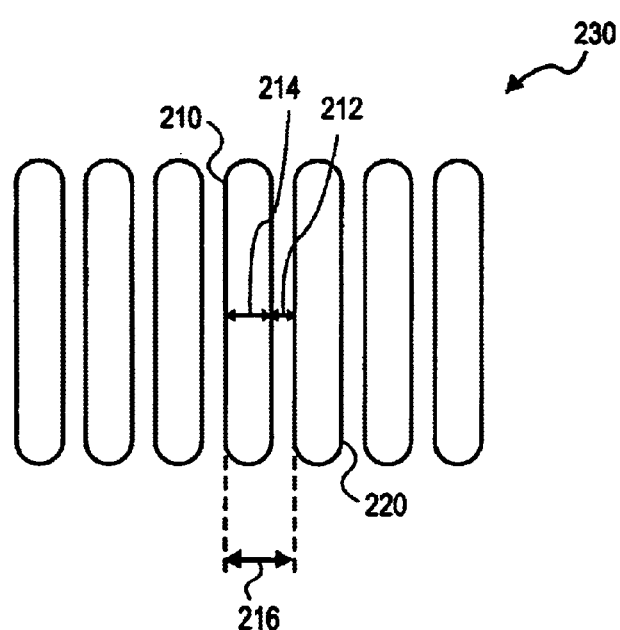
Figure 1C:
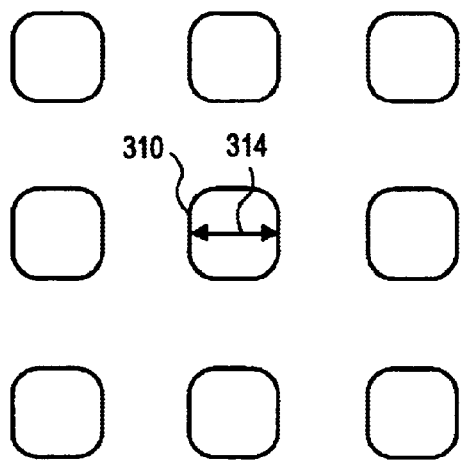
Figure 2A:
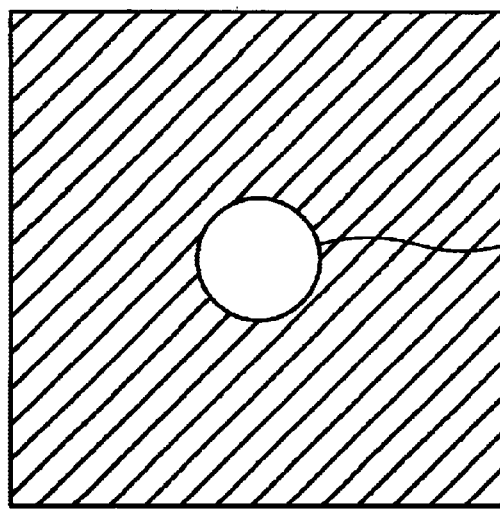
FIG. 2 (a) is an illustration of a plane view of a conventional aperture in the prior art.
Figure 2B:
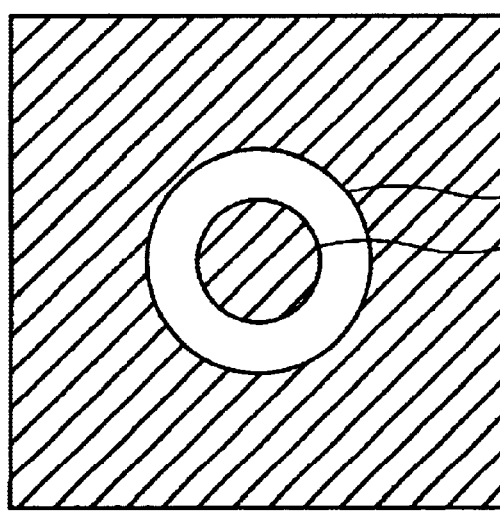
Figure 2C:
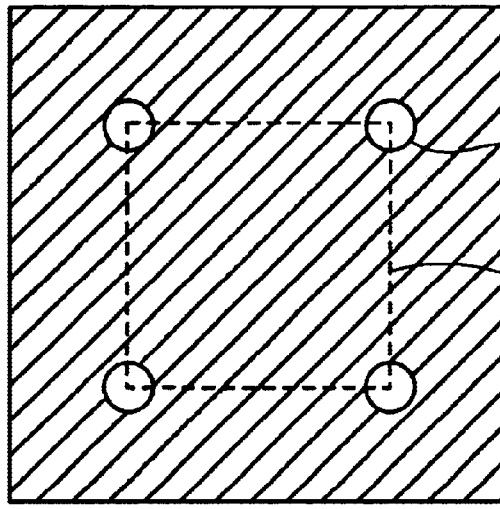
Figure 3A:
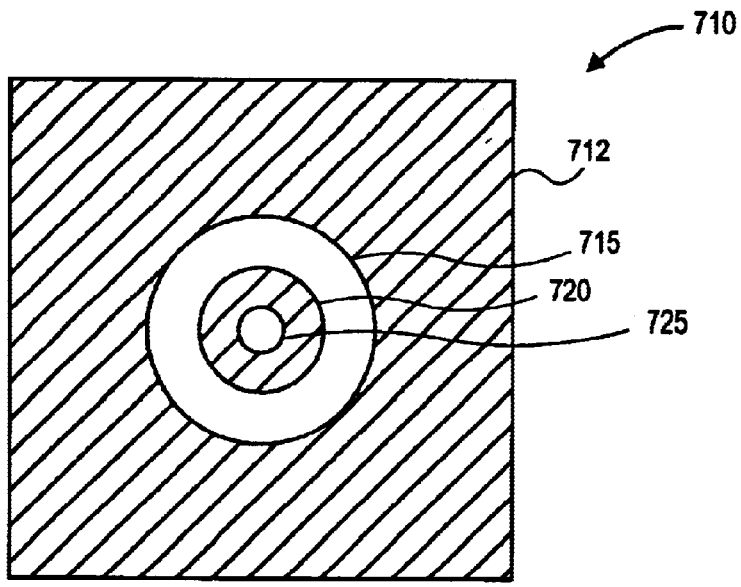
FIG. 3 (a) is an illustration of a plane view of a modified annular aperture according to the present invention.
Figure 3B:
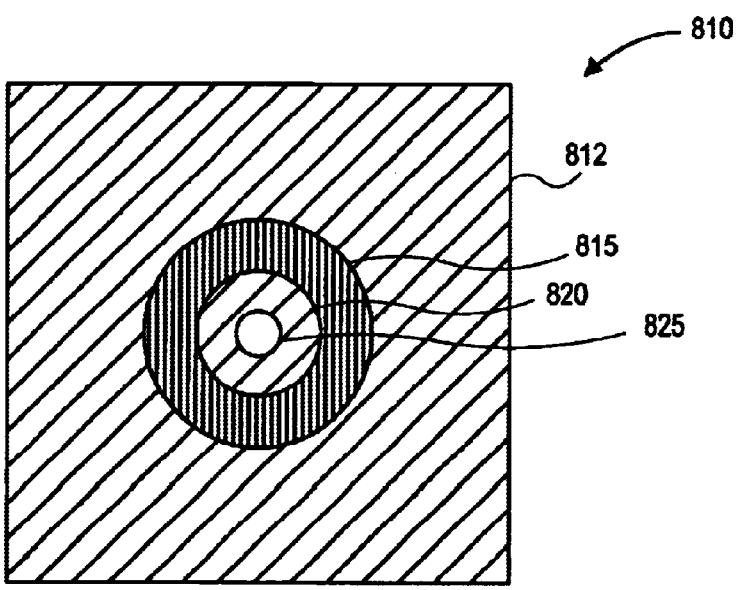

In one embodiment of the present invention, as shown in FIG. 3 (a), the center of an annular aperture has been unblocked so as to include all or part of the type 2 illumination to augment OAI. When a high lens NA setting is used, a portion of the type 1 illumination is also included. The modified annular aperture 710 of the claimed invention has an annular opening 715 around a central circular opening 725 in an opaque plate 712. The annular opening 715 and the central circular opening 725 are separated by an opaque annulus 720. For example, in a situation where the lens NA is 0.55, it is possible to use a modified annular aperture 710 with a sigma of 0.72 for the annular opening 715, a sigma of 0.58 for the opaque annulus 720, and a sigma of 0.28 for the central circular opening 725.

In a second embodiment of the present invention, as shown in FIG. 3 (b), lithographic performance may be maximized by modulating or attenuating the intensity profile of the added illumination with respect to the intensity of the OAI. For example, a filter may be used in a further modified annular aperture 810 to reduce the intensity of the light passing through the annular opening 815 with respect to the light passing through the central circular opening 825. Other techniques include, but are not limited to, the addition of extra optics in the imaging system. For example, optical elements may be used to shape the illumination into an annulus and a central disk.

Figure 4A:
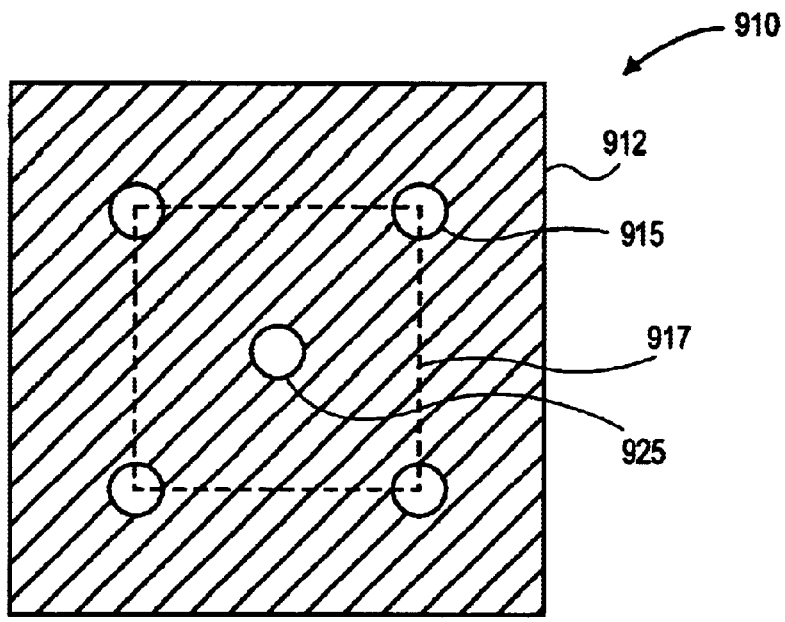
FIG. 4 (a) is an illustration of a plane view of a modified quadrupole aperture according to the present invention.
Figure 4B:
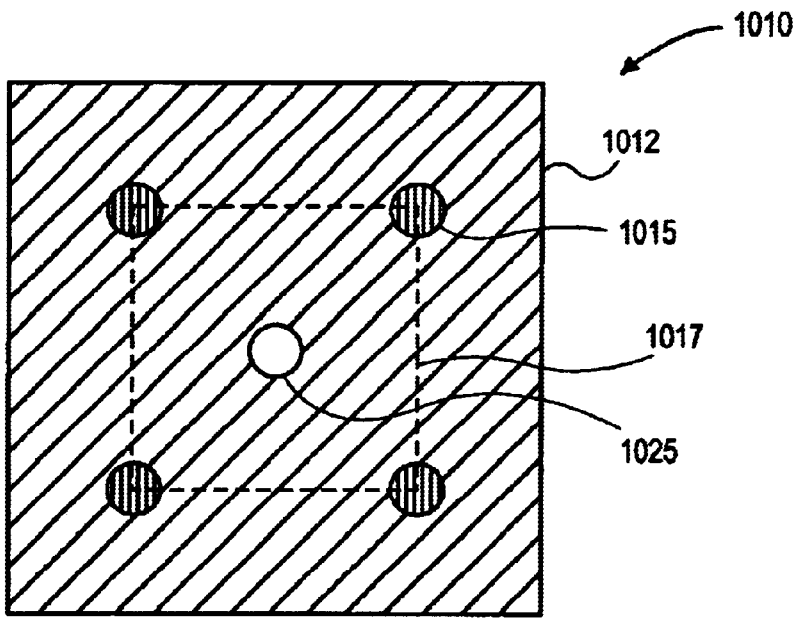

In a third embodiment of the present invention, as shown in FIG. 4 (a), the center of a quadrupole aperture has been unblocked so as to include all or part of the type 2 illumination to augment OAI. When a high lens NA setting is used, a portion of the type 1 illumination is also included. The modified quadrupole aperture 910 of the claimed invention may be considered as having an imaginary square 917 within an opaque plate 912 that has a circular opening 915 located at each corner of the imaginary square 917 and a central circular opening 925 located at the center of the imaginary square 917.

In a fourth embodiment of the present invention, as shown in FIG. 4 (b), lithographic performance may be maximized by modulating or attenuating the intensity profile of the added illumination with respect to the intensity of the OAI. In one case, at least one of the off-axis components of the illumination beam may be modulated. For example, a filter may be used in a further modified quadrupole aperture 1010 to reduce the intensity of the light passing through the quadrupole openings 1015 with respect to the light passing through the central circular opening 1025. In another case, the on-axis component of the illumination beam may be modulated.

Other techniques include, but are not limited to, the addition of extra optics in the imaging system. For example, optical elements may be used to shape the illumination into quadrupoles and a central disk.

In other embodiments of the present invention, the central opening and the at least one peripheral opening may have different quantities, sizes, and shapes, including, but not limited to, squares or diamonds or polygons. The openings may be irregular or asymmetrical or, in the case of the corner openings in a modified quadrupole aperture, different from each other. As appropriate, the quantities, shapes and sizes of the openings and the modulation of the intensity profile may be customized so as to compensate for variability due to other sources, such as non-uniformities in the illumination or aberrations in the optics.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

I claim:

1. An apparatus comprising:
    a source of light;
    optical elements; and
    an aperture, said aperture comprising:
        an opaque plate;
        a central opening disposed in said opaque plate; and
        at least one peripheral opening disposed away from said central opening in said opaque plate wherein said at least one peripheral opening comprises four openings equidistant from said central opening and wherein a filter may reduce intensity of said light passing through said at least one peripheral opening with respect to said light passing through said central opening.

2. A method comprising:
    providing an illumination beam;
    forming an on-axis component of said illumination beam;
    forming at least one off-axis component of said illumination beam wherein said at least one off-axis component of said illumination beam is annular; and
    combining said on-axis component and said at least one off-axis component into an exposure beam.

3. The method of claim 2 further comprising modulating intensity of said at least one off-axis component of said illumination beam.

4. The method of claim 2 further comprising modulating intensity of said on-axis component of said illumination beam.

* * * * *